(12) United States Patent
Yamada et al.

(10) Patent No.: US 10,920,960 B2
(45) Date of Patent: *Feb. 16, 2021

(54) LIGHT-EMITTING DEVICE AND INTEGRATED LIGHT-EMITTING DEVICE

(71) Applicant: NICHIA CORPORATION, Anan (JP)

(72) Inventors: Motokazu Yamada, Tokushima (JP); Yuichi Yamada, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/784,616

(22) Filed: Feb. 7, 2020

(65) Prior Publication Data

US 2020/0318808 A1 Oct. 8, 2020

Related U.S. Application Data

(63) Continuation of application No. 15/853,472, filed on Dec. 22, 2017, now Pat. No. 10,598,342.

(30) Foreign Application Priority Data

Dec. 26, 2016 (JP) .............................. JP2016-251898

(51) Int. Cl.
*F21V 7/00* (2006.01)
*F21V 3/00* (2015.01)
(Continued)

(52) U.S. Cl.
CPC .......... *F21V 7/0083* (2013.01); *H01L 33/505* (2013.01); *H01L 33/54* (2013.01);
(Continued)

(58) Field of Classification Search
CPC ................................ F21V 11/06; F21S 10/005
(Continued)

(56) References Cited

U.S. PATENT DOCUMENTS

2007/0138494 A1  6/2007  Pugh et al.
2007/0284600 A1  12/2007  Shchekin et al.
(Continued)

FOREIGN PATENT DOCUMENTS

JP   2007-173849 A   7/2007
JP   2008-004948 A   1/2008
(Continued)

OTHER PUBLICATIONS

Non-Final Office Action on U.S. Appl. No. 15/853,472 dated Apr. 4, 2019.
(Continued)

*Primary Examiner* — Edwyn Labaze
(74) *Attorney, Agent, or Firm* — Foley & Lardner LLP

(57) ABSTRACT

A light-emitting device includes: a base member that comprises conductor wirings; a light-emitting element that is mounted on the base member and emits first light; a wavelength conversion member that is disposed on or above an upper surface of the light-emitting element and is adapted to absorb at least part of the first light and emit second light with a wavelength longer than a wavelength of the first light; a light-reflective film that is disposed on an upper surface of the wavelength conversion member; and an encapsulating member that covers the light-emitting element, the wavelength conversion member, and the light-reflective film. A ratio (H/W) of a height (H) to a width (W) of the encapsulating member is smaller than 0.5.

15 Claims, 4 Drawing Sheets

(51) Int. Cl.
  *H01L 33/62* (2010.01)
  *H01L 33/54* (2010.01)
  *H01L 33/50* (2010.01)
  *F21K 9/68* (2016.01)
  *H01L 25/075* (2006.01)
  *H01L 33/60* (2010.01)
  *F21Y 115/10* (2016.01)

(52) U.S. Cl.
  CPC ............... *H01L 33/62* (2013.01); *F21K 9/68* (2016.08); *F21V 3/00* (2013.01); *F21Y 2115/10* (2016.08); *H01L 25/0753* (2013.01); *H01L 33/50* (2013.01); *H01L 33/60* (2013.01); *H01L 2224/16225* (2013.01)

(58) Field of Classification Search
  USPC .............................. 362/235, 227, 230, 257
  See application file for complete search history.

(56) References Cited

U.S. PATENT DOCUMENTS

| | | |
|---|---|---|
| 2008/0049430 A1 | 2/2008 | Sakumoto |
| 2008/0308824 A1 | 12/2008 | Shchekin et al. |
| 2008/0315228 A1 | 12/2008 | Krames et al. |
| 2009/0045416 A1 | 2/2009 | Bierhuizen et al. |
| 2009/0052158 A1* | 2/2009 | Bierhuizen ........... H01L 33/644 362/84 |
| 2009/0141492 A1 | 6/2009 | Fujino et al. |
| 2011/0019397 A1 | 1/2011 | Wang et al. |
| 2011/0121341 A1 | 5/2011 | Lee et al. |
| 2012/0212931 A1 | 8/2012 | Kinoshita et al. |
| 2013/0193468 A1 | 8/2013 | Hussell et al. |
| 2015/0001564 A1 | 1/2015 | Oguro et al. |
| 2016/0054501 A1 | 2/2016 | Hikmet et al. |
| 2016/0093780 A1 | 3/2016 | Beppu et al. |
| 2017/0229624 A1 | 8/2017 | Beppu et al. |
| 2018/0151786 A1 | 5/2018 | Beppu et al. |

FOREIGN PATENT DOCUMENTS

| | | |
|---|---|---|
| JP | 2010-050236 A | 3/2010 |
| JP | 2010-092672 A | 4/2010 |
| JP | 2010-530082 A | 9/2010 |
| JP | 2010-537400 A | 12/2010 |
| JP | 2012-216764 A | 11/2012 |
| JP | 2015-012206 A | 1/2015 |
| JP | 2016-072304 A | 5/2016 |

OTHER PUBLICATIONS

Notice of Allowance on U.S. Appl. No. 15/853,472 dated Nov. 8, 2019.

* cited by examiner

LIGHT-EMITTING DEVICE AND INTEGRATED LIGHT-EMITTING DEVICE

CROSS-REFERENCE TO RELATED APPLICATIONS

The present application is a continuation of U.S. patent application Ser. No. 15/853,472, filed on Dec. 22, 2017, which claims priority to Japanese Patent Application No. 2016-251898, filed on Dec. 26, 2016, the disclosures of which are hereby incorporated by reference in their entireties.

BACKGROUND

The present disclosure relates to a light-emitting device and an integrated light-emitting device.

Various electronic components have recently been proposed and put to practical use, and they are increasingly required to exhibit high performance. In particular, electronic components are required to maintain their performance for a long time even under severe environments. Light-emitting devices employing semiconductor light-emitting elements, such as light emitting diodes (LED), are also required to meet such demands. That is, the expected performance of light-emitting devices is becoming higher by the day, and further enhancement in output (e.g., luminance) and reliability is required in the fields of general lighting and lighting for vehicles. In addition, light-emitting devices are required to be supplied at low prices while maintaining such high performance.

There is a strong demand for slimming down backlights used for liquid crystal televisions and general lighting apparatuses because their design qualities are valued.

For example, Japanese Unexamined Patent Application Publication No. 2008-4948 discloses a light-emitting device in which a reflector is disposed on the upper surface of a light-emitting element flip-chip mounted on a submount to slim down a backlight.

However, conventional backlights do not sufficiently meet the demand for slimming down.

SUMMARY

Embodiments described in the present disclosure have been made in view of the above-mentioned circumstances. One object of the disposed embodiments is to provide a light-emitting device that has a broad light distribution and that can emit light with one of various emission colors.

A light-emitting device according to one embodiment includes: a base member that includes conductor wirings; a light-emitting element that is mounted on the base member and emits first light; a wavelength conversion member that is disposed on or above an upper surface of the light-emitting element and absorbs at least part of the first light to re-emit light with a wavelength longer than a wavelength of the first light; a light-reflective film that is disposed on an upper surface of the wavelength conversion member; and an encapsulating member that covers the light-emitting element, the wavelength conversion member, and the light-reflective film. A ratio (H/W) of a height (H) to a width (W) of the encapsulating member is smaller than 0.5.

According to certain embodiments, a white light source with a broad light distribution can be provided without forming a phosphor sheet over the entire lighting tool or using a secondary lens. Thus, in the case in which the light-emitting device according to the present embodiment is applied to, for example, a backlight, a slim backlight can be provided.

DETAILED DESCRIPTION

The following describes embodiments of the present invention with reference to the accompanying drawings as appropriate. Light-emitting devices to be described below are intended to embody a technical concept and do not limit the present invention to the devices described below unless specifically stated otherwise. Constitutions described regarding one embodiment or example are applicable to other embodiments and examples.

Additionally, in the description below, the same term or reference number represents the same or similar member, and repetitive detailed description will be omitted as appropriate. Further, a plurality of elements may be alternatively formed of one member so that the member serves the same function as the plurality of elements, or conversely, a combination of a plurality of members may serve the function of one member.

First Embodiment

Figure 1A:
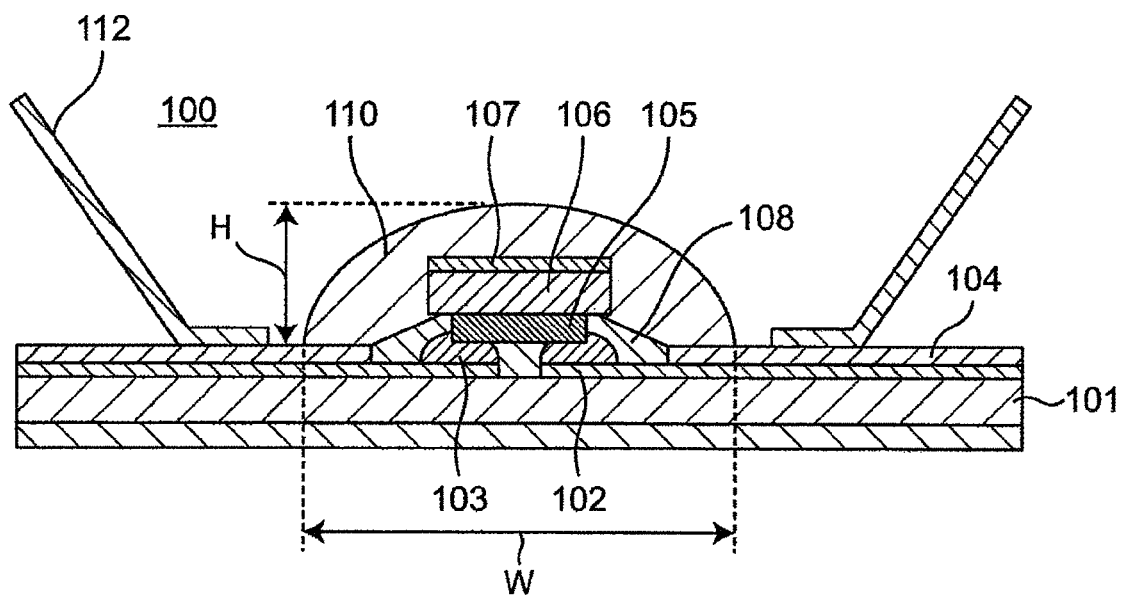
FIG. 1A is a schematic sectional view of an illustrative light-emitting device in a first embodiment.

FIG. 1A is a schematic sectional view illustrating the structure of a light-emitting device in a first embodiment (i.e., light-emitting device 100).

As shown in FIG. 1A, the light emitting device 100 includes a base member 101 in which conductor wirings 102 is provided on its surface, and a light-emitting element 105 mounted on the base member 101. The light-emitting element 105 is flip-chip mounted with connecting members 103 disposed therebetween in such a manner as to straddle the gap between the at least one pair of conductor wirings 102 disposed on the surface of the base member 101. A wavelength conversion member 106 having a size larger than the light-emitting element 105 is disposed on or above the light-extracting surface side of the light-emitting element 105 (i.e., upper surface side of the light-emitting element 105), and a light-reflective film 107 is formed on the light-extracting surface side of the wavelength conversion member 106. Specifically, the area of the bottom surface of the wavelength conversion member 106, which faces the light-emitting element 105, is larger than the area of the upper surface of the light-emitting element 105. The wavelength conversion member 106 is disposed on of above the light-emitting element 105 such that the outer peripheral edge of the upper surface of the light-emitting element 105 is located inside the outer peripheral edge of the bottom surface of the wavelength conversion member 106. The light-reflective film 107 is disposed over substantially the entire light-extracting surface of the wavelength conversion member 106. The light-emitting device 100 in the first embodiment also includes a light-transmissive encapsulating member 110 that covers the light-emitting element 105 and the wavelength conversion member 106. An insulating member 104 may be disposed on the conductor wirings 102 except for at least regions that are electrically connected to the light-emitting element 105. Members indicated by a reference numeral 112 in FIG. 1A are light-reflective members disposed as appropriate, which may be made in a manner described later in a fourth embodiment, or may be lateral walls of a package.

The light-reflective film 107 reflects, for example, 70% or more of the total amount of light emitted from the light-emitting element 105 and light generated by wavelength conversion in the wavelength conversion member 106. Thus, regarding light emitted from the light-emitting element 105 and the wavelength conversion member 106, the light-reflective film 107 reflects much of the light in the vertical direction of the base member 101 (i.e., upper surface of the light-emitting element 105), thereby increasing the light in the horizontal direction of the base member 101. Such a structure provides a batwing light distribution characteristic.

The batwing light distribution characteristic here is a light distribution characteristic that has a first peak in a first region where the light distribution angle is 90° or less, and a second peak in a second region where the light distribution angle is 90° or more; and the intensities of the first and second peaks are larger than the intensity at a light distribution angle of 90°.

In the light-emitting device 100 in the first embodiment, the lateral surfaces of the light-emitting element 105 are preferably covered with a white member 108, such as a white resin, as shown in FIG. 1A. With this structure, substantially the entire light emitted from the light-emitting element 105 passes through the wavelength conversion member 106. Accordingly, light emitted from the wavelength conversion member 106 constitutes substantially the entire light emitted from the light-emitting device 100, so that color non-uniformity depending on the light distribution angle is mitigated. In the case in which the lateral surfaces of the light-emitting element 105 are not covered with the white resin, the emission color of the light-emitting element 105 is directly observed when the light-emitting device 100 is observed from a large light distribution angle, and therefore, the color difference in light emitted from the wavelength conversion member 106 disposed above will be noticeable.

The light-emitting element 105 and the wavelength conversion member 106 are covered with the light-transmissive encapsulating member 110. The encapsulating member 110 protects the light-emitting element 105 and the like against external environments, and optically controls light output from the wavelength conversion member 106 and the like. Thus, the encapsulating member 110 is disposed on the base member to cover the light-emitting element 105 and the wavelength conversion member 106. The encapsulating member 110 has a substantially dome shape. In the present embodiment, the encapsulating member 110 directly covers the wavelength conversion member 106.

The encapsulating member 110 is formed preferably such that its outer shape is circular or elliptic in a top view, and the ratio of the height (H) of the encapsulating member in the optical axis direction to the diameter (width: W) of the encapsulating member in a top view is smaller than 0.5. In the case of an ellipse, the width includes the major axis and the minor axis, and the minor axis is referred to as an encapsulating diameter (W) in the present specification. The surface of the encapsulating member 110 is, for example, a convex surface.

Such a structure allows light emitted from the wavelength conversion member 106 to be refracted at the interface between the encapsulating member 110 and the air, thereby further broadening the light distribution.

The height (H) of the encapsulating member here means the maximum height from the mounting surface of the light-emitting element 105 as shown in FIG. 1A. The width (W) of the encapsulating member means the diameter as described above in the case in which the bottom surface of the encapsulating member has a circular shape, and in the case of the other shapes, the width (W) means the shortest length across the shape.

Figure 1B:
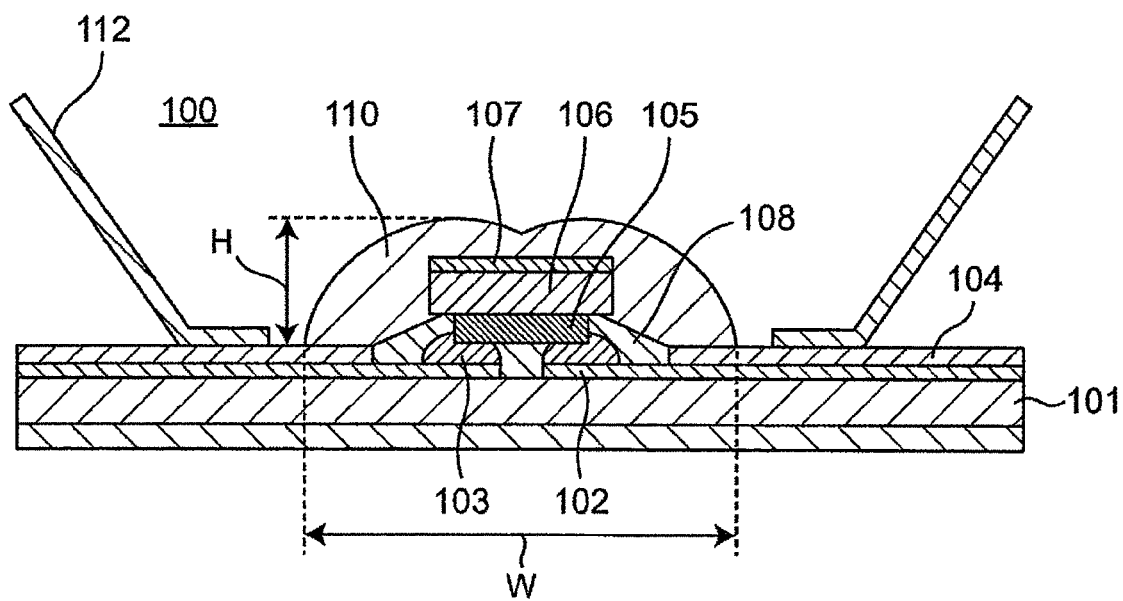
FIG. 1B is a schematic sectional view of an illustrative light-emitting device in a modification of the first embodiment.

Although the surface of the encapsulating member 110 in the light-emitting device 100 in the first embodiment shown in FIG. 1A is a convex surface, a central portion in the optical axis direction of the encapsulating member 110 desirably has a flat or concave shape to further broaden the light distribution. In particular, forming the central portion in the optical axis direction of the encapsulating member 110 into a concave shape as shown in FIG. 1B decreases an amount of light traveling in the optical axis direction using the lens effect, thereby providing a batwing light distribution with a broader light distribution.

An example of the light-emitting device 100 according to the present embodiment is described below.

Base Member 101

The base member 101 is a member on which the light-emitting element 105 is mounted. The base member 101 includes the conductor wirings 102 on its surface, the conductor wirings 102 supplying electricity to the light-emitting element 105.

Examples of the material of the base member 101 include ceramics and resins, such as phenolic resins, epoxy resins, polyimide resins, BT resins, polyphthalamide (PPA), polyethylene terephthalate (PET), and polyethylene naphthalate (PEN). It is preferable to select a resin as the material in view of low costs and ease of molding. The thickness of the substrate can be selected appropriately, and the substrate may be a flexible substrate that can be manufactured by roll-to-roll processing, or a rigid substrate. The rigid substrate may be a slim rigid substrate that can be bent.

To make the light-emitting device resistant to heat and light, it is preferable to select a ceramic as the material for the base member 101. Examples of the ceramic include alumina, mullite, forsterite, glass ceramics, and nitride (e.g., AlN) and carbide (e.g., SiC) ceramics. Among these, it is preferable to use a ceramic made of alumina or containing alumina as the main component.

In the case in which a resin is used as the material to constitute the base member 101, an inorganic filler such as glass fiber, $SiO_2$, $TiO_2$, or $Al_2O_3$, can be mixed into the resin to improve the mechanical strength, reduce the thermal expansion coefficient, and improve the light reflectance. The base member 101 is only required to be capable of electrically insulating the pair of conductor wirings 102, and what is called a metal substrate, which is made by forming an insulating layer on a metal member, may be used.

Conductor Wirings 102

The conductor wirings 102 are electrically connected to electrodes of the light-emitting element 105 and supply a current (i.e., electricity) from outside. That is, the conductor wirings 102 function as electrodes for supplying electricity from outside, or as part of the electrodes. Commonly, the conductor wirings are formed of at least two wirings, namely positive and negative wirings, separated from each other.

The conductor wirings 102 are formed at least on the upper surface, on which the light-emitting element 105 is to be mounted, of the base member. The material for the conductor wirings 102 can be selected appropriately depending on the material used as the base member 101 and the manufacturing method. For example, in the case in which a ceramic is used as the material for the base member 101, the material for the conductor wirings 102 is preferably a material having a melting point that is high enough to endure sintering temperatures of a ceramic sheet. A metal with a high melting point, such as tungsten and molybdenum, is preferably used. In addition, the material may be covered with another metal material, such as nickel, gold, and silver, by plating, sputtering, vacuum evaporation, or the like.

In the case in which a glass epoxy resin is used as the material for the base member 101, the material for the conductor wirings 102 is preferably a material that is easy to process. In the case in which an injection-molded epoxy resin is used, the material for the conductor wirings 102 is preferably a member that is easy to process by punching, etching, bending, or the like, and that has comparatively high mechanical strength. Specific examples include metals such as copper, aluminum, gold, silver, tungsten, iron, and nickel, and metal layers and lead frames made of materials such as iron-nickel alloys, phosphor bronze, copper-iron alloys, and molybdenum. The surface of a lead frame may be covered with another metal material different from the material for the lead frame itself. The material is not particularly limited, and examples thereof include silver alone or alloys of silver and another metal such as copper, gold, aluminum, and rhodium, and a multilayer film made of silver or the above-mentioned alloys. For the method of covering with the metal material, sputtering or vapor deposition can be employed, instead of plating.

Connecting Members 103

The connecting members 103 fixes the light-emitting element 105 to the base member 101 or the conductor wirings 102. In the case of flip-chip mounting as in the present embodiment, electrically-conductive members are used. Specific examples include Au-containing alloys, Ag-containing alloys, Pd-containing alloys, In-containing alloys, Pb—Pd-containing alloys, Au—Ga-containing alloys, Au—Sn-containing alloys, Sn-containing alloys, Sn—Cu-containing alloys, Sn—Cu—Ag-containing alloys, Au—Ge-containing alloys, Au—Si-containing alloys, Al-containing alloys, Cu—In-containing alloys, and mixtures of metals and fluxes.

As the connecting member, liquid, paste, or solid (sheet-shaped, block-shaped, powdered, or wire-shaped) members may be used. Appropriate members can be selected depending on the shape of the base member and the composition. The connecting members 103 may be made of a single kind of member or a combination of several kinds of members.

Insulating Member 104

The conductor wirings 102 are preferably covered with the insulating member 104 except for portions electrically connected to the light-emitting element 105 and other materials. That is, as shown in drawings, a resist may be disposed on the base member to insulate and cover the conductor wirings 102, and the insulating member 104 can function as the resist.

The insulating member 104 can be disposed not only to insulate the conductor wirings 102 but to inhibit or prevent leakage and absorption of light by containing a white filler into the insulating member 104, thereby enabling enhancememnt of the light extraction efficiency of the light-emitting device 100.

The material for the insulating member 104 is not particularly limited as long as the material has an insulating property and is adapted not to absorb light from the light-emitting element. Examples of the material include an epoxy resin, a silicone resin, a modified silicone resin, a urethane resin, an oxetane resin, an acrylic resin, a polycarbonate resin, or a polyimide resin.

Light-Emitting Element 105

A known element can be used as the light-emitting element 105 mounted on the base member. In the present embodiment, a light emitting diode is preferably used as the light-emitting element 105.

Any given wavelength can be selected as the emission wavelength of the light-emitting element 105. Examples of a blue or green light-emitting element include a light-emitting element including ZnSe, a nitride semiconductor (e.g., $In_xAl_yGa_{1-x-y}N$ where $0 \leq X$, $0 \leq Y$, $X+Y \leq 1$), or GaP. A light-transmissive sapphire substrate or the like can be used as a growth substrate. GaAlAs, AlInGaP, or the like can be used in a red light-emitting element. Semiconductor light-emitting elements made of other materials can also be used. The compositions, emission colors, sizes, and number of the light-emitting elements to be used may be selected appropriately depending on the purpose.

The emission wavelengths can be selected by changing the materials for the semiconductor layers and their mixed crystal ratios. The light-emitting element may have the positive and negative electrodes on the same surface to enable flip-chip mounting, or the positive and negative electrodes may be disposed on different surfaces.

The light-emitting element 105 in the present embodiment includes a light-transmissive substrate and semiconductor layers layered on the substrate. The semiconductor layers include an n-type semiconductor layer, an active layer, and a p-type semiconductor layer in order. An n-type electrode is formed on the n-type semiconductor layer, and a p-type electrode is formed on the p-type semiconductor layer.

The light-emitting element 105 is flip-chip mounted on the conductor wirings 102 of the surface of the base member 101 using the connecting members 103 disposed therebetween as shown in FIG. 1A and other drawings, and the surface opposite to the surface on which the electrodes are formed, in other words, the main surface of the light-transmissive substrate, serves as the light-extracting surface. However, the light-reflective film 107 is formed on the light-extracting surface in the present embodiment, therefore, the lateral surfaces of the light-emitting element 105 serve as substantial light-extracting surfaces. That is, part of light emitted from the light-emitting element 105 toward the main surface of the light-emitting element 105 is directed back by the light-reflective film 107 into the light-emitting element 105, repeatedly reflected within the light-emitting element 105, and output from the lateral surfaces of the light-emitting element 105. Accordingly, the light distribution characteristic (see FIG. 4) of the light-emitting device 100 is the combination of light passing through the light-reflective film 107 and the light emitted from the lateral surfaces of the light-emitting element 105.

The light-emitting element 105 straddles the gap between the two conductor wirings 102, namely positive and negative wirings, electrically separated from each other. The light-emitting element 105 is electrically connected and mechanically fixed using the electrically-conductive connecting members 103. The light-emitting element 105 can be mounted using, for example bumps, instead of a solder paste. Alternatively, a small packaged product that incorporates a light-emitting element encapsulated in a resin or the like can be used as the light-emitting element 105, and its shape and structure are not particularly limited.

As described later, in the case of a light-emitting device in which a wavelength conversion member is provided, suitable examples include nitride semiconductors ($In_xAl_yGa_{1-x-y}N$, $0 \leq X$, $0 \leq Y$, $X+Y \leq 1$), which can emit light with short wavelengths capable of efficiently exciting the wavelength conversion member 106.

The foregoing is an example employing flip-chip mounting, but the mounting may be performed in a manner such that the electrodes formed on the upper surface of the light-emitting element are connected to wires, with the insulating substrate side of the light-emitting element being the mounting surface. In this case, the upper surface of the light-emitting element is the electrode formation surface, and the reflective film is formed thereon.

Light-Reflective Film 107

The light-reflective film 107 is formed on the light-extracting surface of the wavelength conversion member 106, which is the main surface. Its material may be a metal or a resin containing a white filler, and is not particularly limited as long as the material reflects at least light emitted from the light-emitting element 105 (also referred to as "first light") or light emitted from the wavelength conversion member 106 (also referred to as "second light").

A dielectric multilayer film can be used, so that the light-reflective film 107 is less likely to absorb light.

Examples of the material for the dielectric multilayer film include metal oxide film materials, metal nitride films, and oxynitride films. Also, organic materials, such as silicone resins and fluorocarbon resins, can be used, and the material is not particularly limited.

Figure 4:
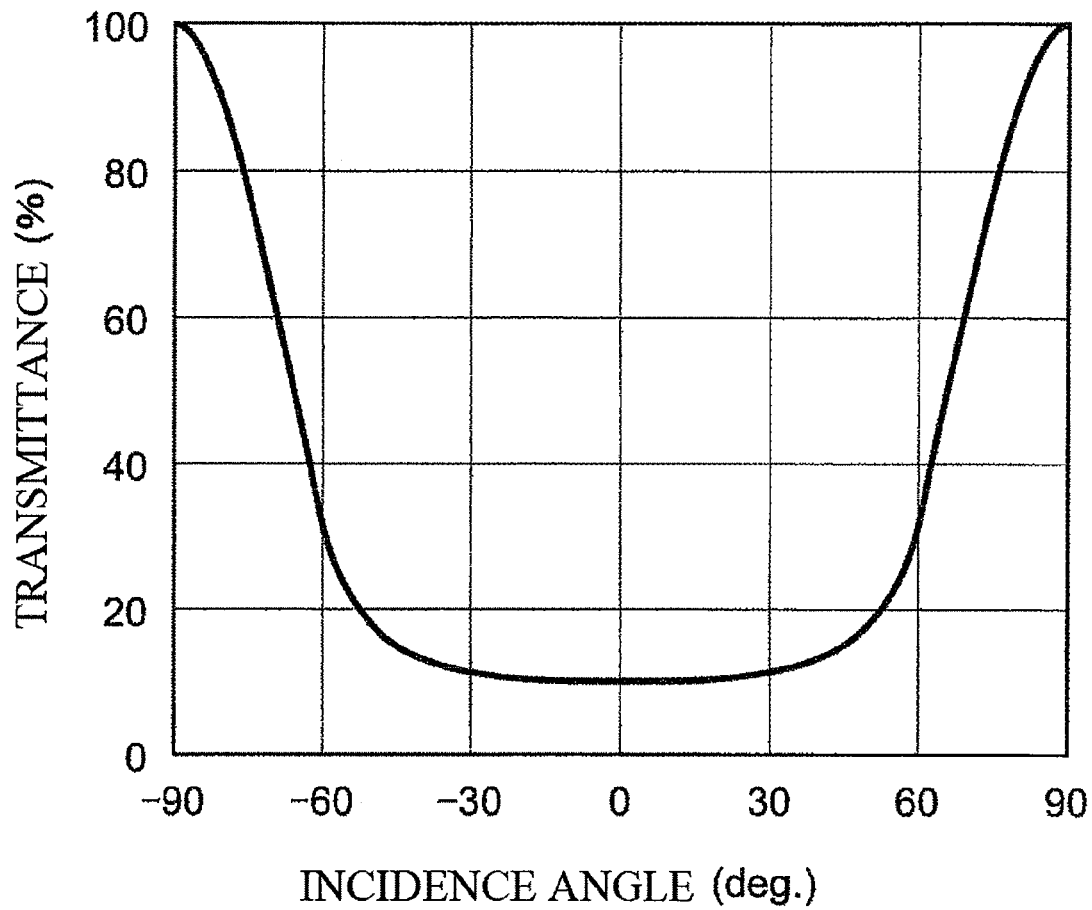
FIG. 4 is a graph showing transmittance versus incidence angle of a dielectric multilayer film.

The dielectric multilayer film has a reflection property for light in the reflection range that depends on the incidence angle, such that reflectance is high for light perpendicularly incident on the dielectric multilayer film, and transmittance is high for light incident at a large angle, as shown in FIG. 4. Accordingly, in the case in which such a dielectric multilayer film is used as the light-reflective film 107 in the light-emitting device in the first embodiment, light emitted from the upper surface of the light-reflective film 107 at large angles relative to the optical axis is added to light emitted from the lateral surfaces of the wavelength conversion member 106. Therefore, the light-emitting device 100 can emit more intense light in the lateral directions. Accordingly, a batwing light distribution characteristic can be realized in which the proportion of light laterally emitted from the light-emitting device 100 is larger (i.e., further enhanced) than the proportion of light emitted in the perpendicular direction. In the present specification, the optical axis is the axis perpendicular to the emitting surface of the light-emitting element 105. The reflection properties of the dielectric multilayer film (e.g., the reflectance for light that is perpendicularly incident and the dependence of the reflectance on the incidence angle) can be adjusted by changing the materials, the number, and the like of dielectric films that are alternately layered. Accordingly, in the case in which such a dielectric multilayer film is used as the light-reflective film 107 in the light-emitting device in the first embodiment, the reflection properties of the dielectric multilayer film can be designed in accordance with a required light distribution characteristic of the light-emitting device, resulting in an achievement of a desired light distribution characteristic in an easy manner.

Wavelength Conversion Member 106

The wavelength conversion member 106 absorbs at least part of the first light emitted from the light-emitting element 105, and re-emits light having a wavelength longer than the wavelength of the first light. The wavelength conversion member 106 is, for example, a plate-shaped or sheet-shaped member containing a phosphor and a light-transmissive material.

As the light-transmissive material, a light-transmissive resin or an inorganic material, such as glass, can be used. Examples of the light-transmissive resin include thermosetting resins such as silicone resins, modified silicone resins, epoxy resins, and phenolic resins, and thermoplastic resins such as polycarbonate resins, acrylic resins, methylpentene resin, and polynorbornene resin. A silicone resin, which has good resistance to light and heat, is particularly suitable for the light-transmissive resin. Examples of the inorganic material include borosilicate glass, quartz glass, sapphire glass, calcium fluoride glass, aluminoborosilicate glass, oxynitride glass, and chalcogenide glass.

A phosphor that can be excited by light emitted from the light-emitting element 105 is used. Examples of a phosphor that can be excited by a blue or ultraviolet light-emitting element include cerium-activated yttrium-aluminum-garnet phosphors (Ce:YAG); cerium-activated lutetium-aluminum-garnet phosphors (Ce:LAG); europium- and/or chromium-activated nitrogen-containing calcium aluminosilicate phosphors ($CaO—Al_2O_3—SiO_2$); europium-activated silicate phosphors (($Sr,Ba)_2SiO_4$); nitride phosphors, such as β-SiAlON phosphors, CASN phosphors, and SCASN phosphors; KSF phosphors ($K_2SiF_6$:Mn); sulfide phosphors; and quantum-dot phosphors. Combinations of such phosphors and blue or ultraviolet light-emitting elements enable light-emitting devices that can emit light with one of various colors (e.g., white light-emitting devices) to be manufactured.

Instead of the above-mentioned phosphors, quantum dots, organic fluorescent materials, organic phosphorescent materials, and the like may be used as the wavelength conversion member 106. The phosphor materials and the like may be used singly or in combination.

Encapsulating Member 110

Examples of the material for the encapsulating member 110 include epoxy resins, silicone resins, mixtures of these resins, and light-transmissive materials such as glass. Among these, a silicone resin is preferably selected in consideration of light resistance and ease of shaping.

The encapsulating member 110 may contain a colorant in addition to a light-diffusing member.

In the case in which the encapsulating member 110 contains these members, the members preferably have minimal effects on the light distribution characteristic. For example, a member to be contained preferably has a particle diameter of 0.2 μm or less because the member having such a diameter less affects the light distribution characteristic. In the present specification, the particle grain diameter means the average grain diameter, and the value of an average particle diameter is determined by Fisher Sub-Sieve Sizers No. (F.S.S.S.No) employing an air permeability method.

The encapsulating member 110 can be formed by compression molding or injection molding to cover the light-emitting element 105 and the wavelength conversion member 106. Instead, the shape of the material for the encapsulating member 110 can be controlled using surface tension of the material itself by dropping of or patterning with the material with an adjusted viscosity on the wavelength conversion member 106.

In the latter case of the above-mentioned forming method, the encapsulating member can be formed in a simpler manner without requiring molds. The viscosity of the material for the encapsulating member in such a forming method can be adjusted to a desired viscosity by using a light-diffusing member, a wavelength conversion member, or a colorant as described above, instead of using its original viscosity.

Second Embodiment

Figure 2:
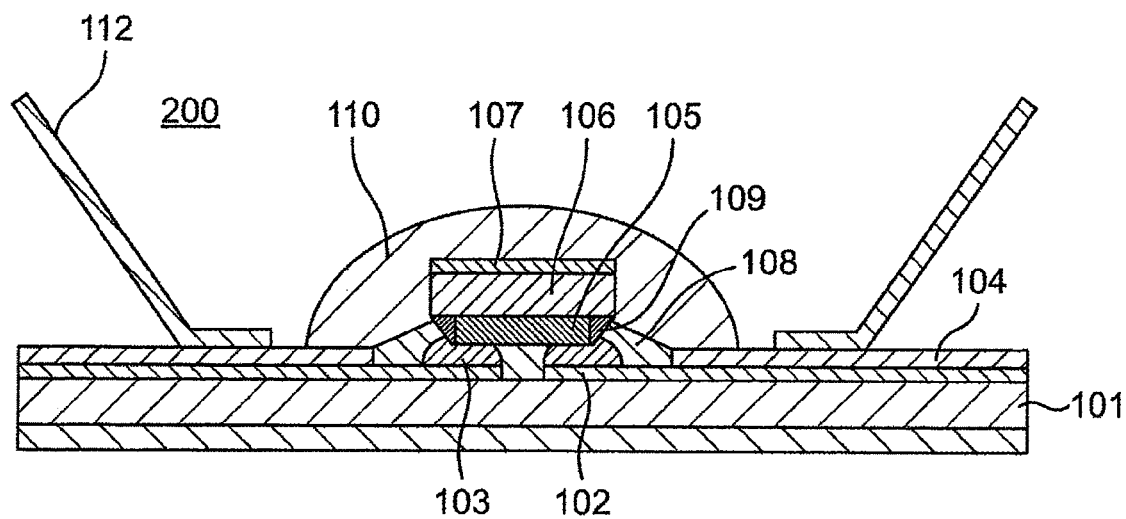
FIG. 2 is a schematic sectional view of an illustrative light-emitting device in a second embodiment.

FIG. 2 is a schematic sectional view of a light-emitting device 200 in a second embodiment.

The light-emitting device 200 in the second embodiment differs from the device in the first embodiment in that a reverse tapered light-transmissive member 109 is formed on the lateral surfaces of the light-emitting element 105 and that the white member 108 is formed extending outside the light-transmissive member 109. The other part of the structure is the same as or similar to the structure in the first embodiment.

The differences from the first embodiment are described below.

As described regarding the light-emitting device in the first embodiment, the area of the bottom surface of the wavelength conversion member 106, which faces the light-emitting element 105 is larger than the area of the upper surface of the light-emitting element 105. The wavelength conversion member 106 is disposed on the light-emitting element 105 such that the outer peripheral edge of the upper surface of the light-emitting element 105 is located inside the outer peripheral edge of the bottom surface of the wavelength conversion member 106. In the present specification and the descriptions below, a portion of the bottom surface of the wavelength conversion member 106 positioned directly above and facing the upper surface of the light-emitting element 105 is referred to as an inner bottom surface. Also, a portion of the bottom surface of the wavelength conversion member 106 positioned outside the inner bottom surface is referred to as a peripheral bottom surface.

The light-emitting device 200 in the second embodiment includes the light-transmissive member 109, which covers the lateral surfaces of the light-emitting element, below the peripheral bottom surface. The surfaces of the light-transmissive member 109 are inclined surfaces that become closer to the lateral surfaces of the light-emitting element 105 as the distance from the wavelength conversion member 106 increases.

In the light-emitting device 200 in the second embodiment that includes the light-transmissive member 109, the light-emitting device 200 having a structure that light emitted from the lateral surfaces of the light-emitting element 105 is reflected off the inclined surfaces of the light-transmissive member 109 and efficiently enters the wavelength conversion member 106, so that the light-emission efficiency is improved. The light-transmissive member 109 may also be formed at the interface between the light-emitting element 105 and the wavelength conversion member 106 to function as an adhesive.

In the light-emitting device 200 in the second embodiment, a low refractive member that has a refractive index smaller than the refractive index of the light-transmissive member 109 may be formed outside the light-transmissive member 109 instead of the white member 108, or may be formed between the white member 108 and the light-transmissive member 109. Examples of the low refractive member that has a refractive index smaller than the refractive index of the light-transmissive member 109 include a light-transmissive member and a white resin each having a refractive index smaller than the refractive index of the light-transmissive member 109.

The light-transmissive member 109 may be made of a light-transmissive resin or a light-transmissive material such as glass. The light-transmissive resin is particularly preferably a light-transmissive thermosetting resin, such as silicone resins, modified silicone resins, epoxy resins, and phenolic resins. The light-transmissive member 109 is in contact with the lateral surfaces of the light-emitting element 105, and therefore easily affected by heat generated by the light-emitting element 105 while the light-emitting element 105 is lighting up. Thermosetting resins are suitable for the light-transmissive member 109 due to its heat resistance. The light-transmissive member 109 preferably has a high light transmittance. Thus, it is generally preferable that the light-transmissive member 109 contain no additives that reflect, absorb, or scatter light. In some cases, however, it is preferable to add an additive to the light-transmissive member 109 in order to impart desirable properties. For example, a variety of fillers may be added to adjust the refractive index of the light-transmissive member 109, or to adjust the viscosity of the light-transmissive member before being cured.

Third Embodiment

Figure 3:
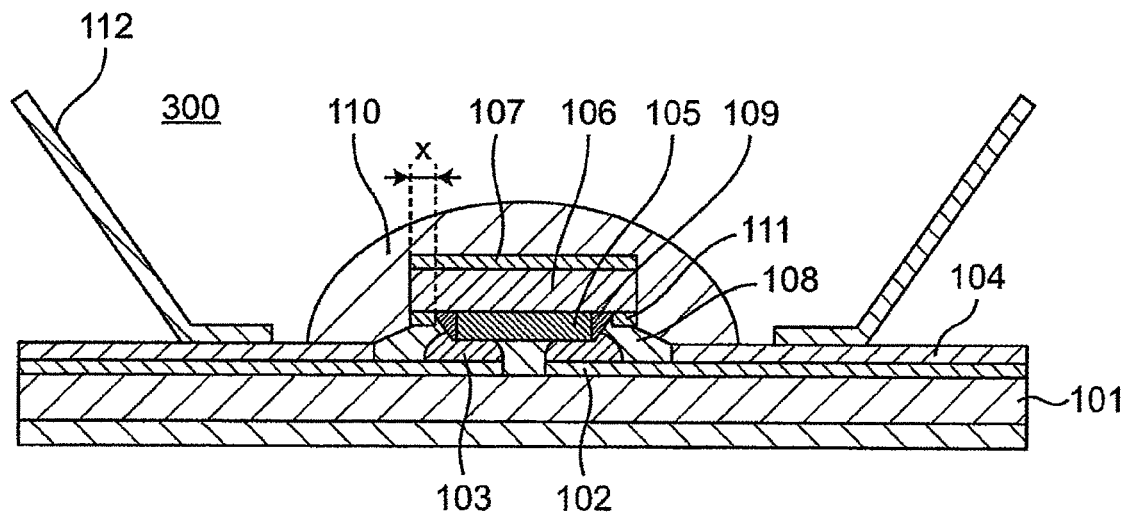
FIG. 3 is a schematic sectional view of an illustrative light-emitting device in a third embodiment.

FIG. 3 is a schematic sectional view of a light-emitting device 300 in a third embodiment.

The light-emitting device 300 in the third embodiment differs from the device in the second embodiment in that an oil-repellent material 111 is formed on the peripheral bottom surface of the lower surface of the wavelength conversion member 106. The other part of the structure is the same as or similar to the structure in the second embodiment.

The following describes the differences from the second embodiment.

In the light-emitting device 300 in the third embodiment, the oil-repellent material 111 is formed along the periphery of the peripheral bottom surface of the wavelength conversion member 106, and the light-transmissive member 109 that covers the lateral surfaces of the light-emitting element 105 is disposed on the peripheral bottom surface except for the portion of the peripheral bottom surface on which the oil-repellent material 111 is formed. The light-transmissive member 109 has inclined surfaces that become closer to the lateral surfaces of the light-emitting element 105 as the distance from the wavelength conversion member 106 increases. As can be seen from the above-mentioned descriptions, the distance x between the inner edge of the oil-repellent material 111 and the periphery of the peripheral bottom surface of the wavelength conversion member 106 is determined such that the light-transmissive member 109 having a desired sectional shape is formed.

Disposing the oil-repellent material 111 having such a structure according to the light-emitting device 300 in the third embodiment can inhibit or prevent the white member 108 from creeping up the lateral surfaces of the wavelength conversion member 106, and reduces variance in the light distribution characteristic. Additionally, in the case in which the light-transmissive member 109 is used as an adhesive for bonding the light-emitting element 105 to the wavelength conversion member 106, the light-transmissive member 109 is less likely to spread, and the light-emitting element 105 can be accurately aligned with the center of the wavelength conversion member 106, and further variance of the shape can be mitigated when forming the reverse tapered shape of the light-transmissive member 109. The oil-repellent material is not particularly limited. For example, a fluorine-based material can be used.

According to the above-mentioned first to third embodiments, light-emitting devices with broad light distributions can be provided.

By employing various combinations of phosphors contained in the light-emitting elements 105 and the wavelength conversion members 106 in the light-emitting devices in the first to third embodiments, light-emitting devices that can emit light having various emission colors.

Thus, light-emitting devices that can emit light having various emission colors with broad light distributions can be provided in the first to third embodiments.

Fourth Embodiment

Figure 5:
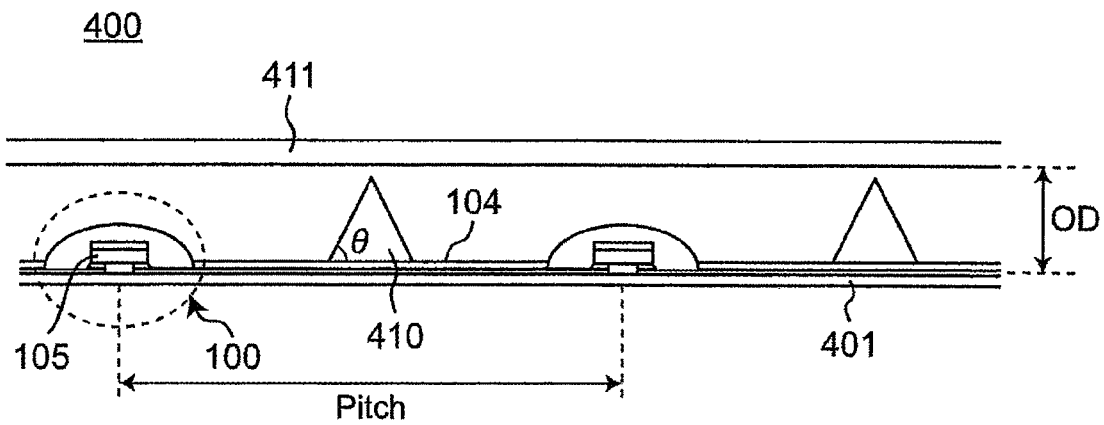
FIG. 5 is a schematic sectional view of a light-emitting module 400 in a fourth embodiment.

FIG. 5 is a schematic sectional view of a light-emitting module 400 in a fourth embodiment.

The light-emitting module 400 in the fourth embodiment is an integrated light-emitting device where a plurality of light-emitting devices 100, each of which have the same structure as in the first embodiment, are disposed on a base member 401, and light-reflective members 410 are disposed between the light-emitting devices 100. A light diffuser 411 that diffuses light emitted from the light-emitting elements 105 is disposed above the light-emitting devices 100 and the light-reflective members 410 such that the light diffuser 411 is substantially parallel to the upper surfaces of the light-emitting elements 105.

A conventional integrated light-emitting device generally has dim portions because the amount of the light in portions between the light-emitting elements 105 decreases on the surface of the light diffuser 411 as the quotient of the distance between the base member and the light diffuser (hereinafter also referred to as an "optical length": OD) divided by the interval (hereinafter also referred to as a "pitch") between the light-emitting elements 105 decreases.

The light-emitting module 400 in the fourth embodiment includes the light-emitting devices 100 having batwing light distribution characteristics and the light-reflective members 410 disposed between the adjacent light-emitting devices 100. This can supplement amount of light in portions between the light emitting devices 100 with light reflected by the light diffuser 411, thereby luminance non-uniformity is reduced on the surface of the light diffuser 411 even in the case of a smaller OD/pitch.

In the light-emitting module 400 in the fourth embodiment, the light reflection surfaces of the light-reflective members 410 are inclined relative to the base member 401. The inclination angle θ of the light reflection surfaces is determined such that luminance non-uniformity is reduced on the surface of the light diffuser 411, in consideration of the light distribution characteristics of the light-emitting devices 100. The light distribution characteristics of the light-emitting devices 100 plurally disposed are preferably such that the amount of light is large in a region where the angle formed with the optical axis, which is defined as the direction perpendicular to the emitting surfaces of the light-emitting elements, is large. Accordingly, luminance non-uniformity can be reduced on the surface of the light diffuser 411, and the slim light-emitting module 400 can be provided.

For example, in the case in which the OD/pitch is as small as 0.2 or less, the elevation angle of light entering the light-reflective members 410 is less than 22° with reference to the emitting surfaces of the light-emitting elements 105. Thus, in the case of a small OD/pitch of 0.2 or less, the light distribution characteristics of the light-emitting devices 100 are preferably such that, for example, the amount of light is large at elevation angles of less than 20° relative to the upper surface of the base member. Thus, the efficiency of light reflection off the light-reflective members 410 can be increased. Specifically, the first and second peaks of the emission intensity are preferably located in an elevation angle range of less than 20°. In other words, with the direction perpendicular to the base member 401 being a light distribution angle of 90°, the light distribution characteristic of each light-emitting device 100 is preferably such that the first peak in the light distribution angle range of 90° to 0° is in the light distribution angle range of less than 20°. Also, the second peak in the light distribution angle range of 90° to 180° is in the light distribution angle range of more than 160°. The amount of light at light distribution angles of less than 20° is preferably 30% or more, more preferably 40% or more, of the total light amount.

Light-Reflective Member 410

As described above, the light-reflective members 410 are disposed between the adjacent light-emitting devices 100.

Their material is not particularly limited as long as the material reflects at least light emitted from the light-emitting devices 100. For example, a metal plate or a resin containing a white filler can be suitably used.

Using dielectric multilayer films as the reflection surfaces of the light-reflective members provides reflection surfaces with low light absorption. In addition, the reflectance can be suitably adjusted by the design of the films, and the reflectance can be controlled by the angle.

The height of the light-reflective members 410 and the inclination angle θ of the light reflection surfaces relative to the surface of the base member 401 can have appropriately set values. The reflection surfaces may be flat or curved surfaces. The optimal inclination angle θ and shape of the reflection surfaces can be determined such that the luminance non-uniformity is reduced on the surface of the light diffuser 411. The height of the light-reflective members 410 is preferably 0.3 times or less, more preferably 0.2 times or less, as large as the distance (i.e., pitch) between the light-emitting elements, so that the slim light-emitting module 400 with reduced luminance non-uniformity is provided.

In the case in which the light-emitting module 400 is used in such an environment that the operating temperature greatly varies, the linear expansion coefficients of the light-reflective members 410 and the base member 401 are preferably close to each other. This is because a large difference in linear expansion coefficients between the light-reflective members 410 and the base member 401 may cause warpage of the light-emitting module 400 due to temperature changes, or may cause deviations in the positional relations between constituent members, particularly between the light-emitting devices 100 and the light-reflective members 410, thereby disabling desired optical properties from being provided. The light-reflective members 410 may be structured of shaped film products using bent films that can be deformed elastically such that warpage of the whole light-emitting module 400 does not occur even in the case in which the linear expansion coefficients are different from each other. In the case in which the light-reflective members 410 are structured of the shaped film products, deformation due to the difference in coefficients of thermal expansion can be dividedly absorbed, thereby disabling warpage of the whole light-emitting module 400.

Figure 6:
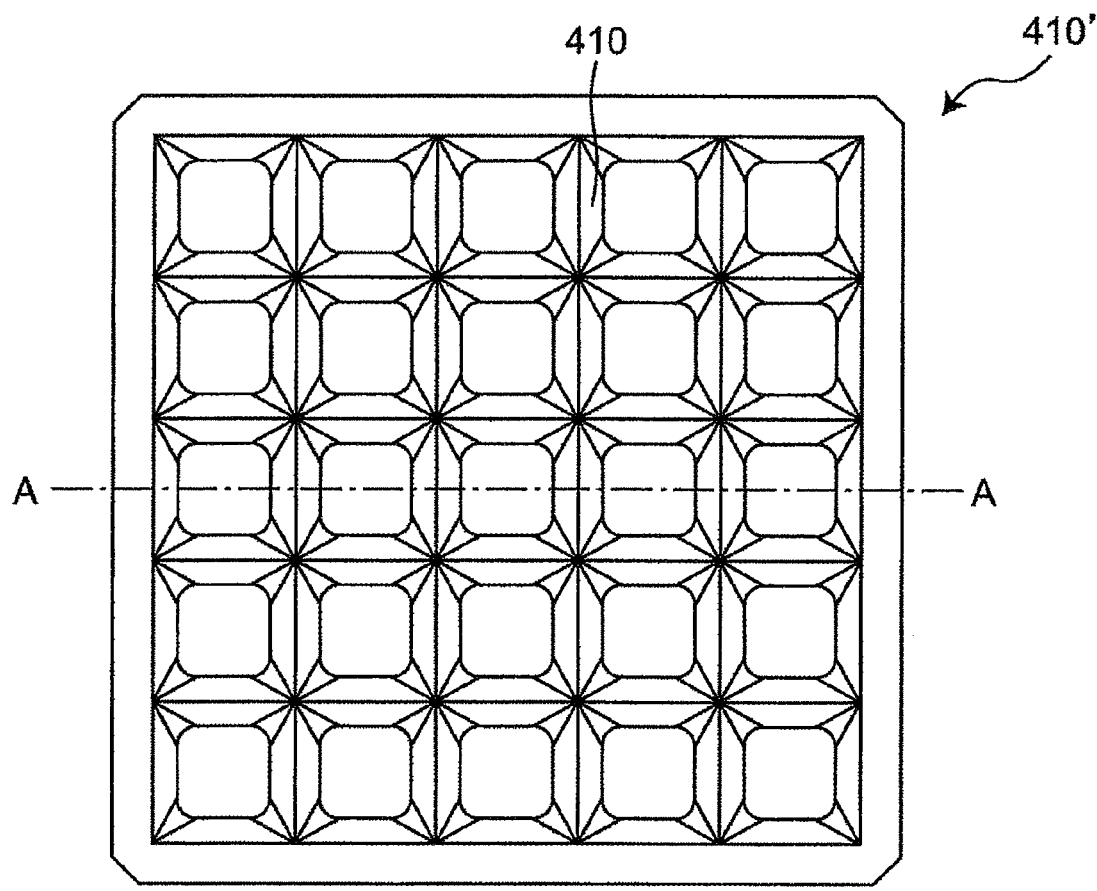
FIG. 6A is a schematic top view of a plate member 410' that can be used in the light-emitting module 400 in the fourth embodiment.
FIG. 6B is a schematic sectional view taken along the line A-A in FIG. 6A.
Figure 6B:

Instead of shaping or producing the light-reflective members 410 individually, a plurality of light-reflective members 410 may be integrally formed to constitute one plate member 410' as shown in FIG. 6A and FIG. 6B. FIG. 6A is a schematic top view of the plate member 410', and FIG. 6B is a schematic sectional view taken along the line A-A in FIG. 6A. The plate member 410' includes, for example, a plurality of through-holes 413 at positions respectively corresponding to the positions of the light-emitting devices 100. The light-reflective members 410 are disposed around each of the through-holes 413. Accordingly, the light reflection surfaces are formed around the through-holes 413 at an inclination angle θ relative to the surface of the base member 401 when the plate member 410' is disposed on the base member 401. The light-emitting devices 100 may be mounted in the through-holes 413 after joining the plate member 410' to the base member 401, or the light-emitting devices 100 may be mounted at predetermined positions on the base member 401, thereafter joining the plate member 410' to the base member 401 such that the light-emitting devices 100 are respectively located in positions corresponding through-holes 413.

The plate member 410' can be formed by molding, vacuum forming, pressure forming, press forming, or the like. Instead of employing the plate member 410', the light-reflective members 410 can be formed on the base member 401 by, for example, direct drawing with a light-reflective resin. The height of the light-reflective members 410 is preferably 0.3 times or less, more preferably, for example, 0.2 times or less, as large as the distance between the light-emitting elements.

The light-emitting module 400 in the fourth embodiment having the above-mentioned structure includes the light-emitting devices 100 having batwing light distribution characteristics with broad light distributions and the light-reflective members 410 respectively disposed between the adjacent light-emitting devices 100, so that a slim light module for a backlight can be provided.

The individual light-emitting devices 100 each include the wavelength conversion member 106 in the light-emitting module 400 in the fourth embodiment having the above-mentioned structure, therefore, a white light module for a backlight can be provided, unlike a conventional light-emitting module in which phosphor sheet is disposed on the upper or lower surface of the light diffuser 411. This structure reduces the quantity of expensive phosphors used, thereby enabling provision of an inexpensive light-emitting module for a backlight.

The above descriptions of the light-emitting module 400 of the fourth embodiment have been made with respect to the example using the light-emitting device 100 in the first embodiment, but other light-emitting devices with broad light distributions, for example, the light-emitting device 200 in the second embodiment and the light-emitting device 300 in the third embodiment, can be used.

The light-emitting devices and the light-emitting module in the present disclosure can be used for backlights for liquid-crystal displays, various lighting apparatuses, and the like.

What is claimed is:

1. A light-emitting device comprising:
a base member that comprises conductor wirings;
a light-emitting element that is mounted on the base member and emits first light;
a wavelength conversion member that is disposed on or above an upper surface of the light-emitting element and is adapted to absorb at least part of the first light and emit second light with a wavelength longer than a wavelength of the first light;
a light-reflective film that is disposed on an upper surface of the wavelength conversion member;
an encapsulating member that covers the light-emitting element, the wavelength conversion member, and the light-reflective film; and
a white member that covers lateral surfaces of the light-emitting element, the white member being in contact with the lateral surfaces of the light-emitting element and in contact with the wavelength conversion member,
wherein a ratio (H/W) of a height (H) to a width (W) of the encapsulating member is smaller than 0.5.

2. The light-emitting device according to claim 1, wherein a surface of the encapsulating member comprises a convex surface.

3. The light-emitting device according to claim 1, wherein the light-reflective film comprises a dielectric multilayer film.

4. The light-emitting device according to claim 1, wherein the wavelength conversion member has a bottom surface positioned on a light emitting element side, and an area of the bottom surface of the wavelength conversion member is larger than an area of the upper surface of the light-emitting element.

5. The light-emitting device according to claim 4, wherein an inner bottom surface of the wavelength conversion member faces the upper surface of the light-emitting element.

6. The light-emitting device according to claim 5, wherein a peripheral bottom surface of the wavelength conversion member surrounds the inner bottom surface.

7. The light-emitting device according to claim 1, wherein 30% or more of a total amount of light emitted from the light-emitting device is emitted in an elevation angle range of less than 20° relative to an upper surface of the base member.

8. The light-emitting device according to claim 1, wherein 40% or more of a total amount of light emitted from the light-emitting device is emitted in an elevation angle range of less than 20° relative to an upper surface of the base member.

9. The light-emitting device according to claim 1, wherein the ratio (H/W) of a height (H) to a width (W) of the encapsulating member is 0.3 or less.

10. The light-emitting device according to claim 1, wherein the light-emitting element is flip-chip mounted.

11. An integrated light-emitting device comprising:
a plurality of light-emitting devices according to claim 1; and
a plurality of light-reflective members respectively disposed between the light-emitting devices.

12. The integrated light-emitting device according to claim 11, wherein a height of the light-reflective members is a maximum of 0.3 times a distance between the light-emitting devices.

13. The integrated light-emitting device according to claim 11, wherein a height of the light-reflective members is a maximum of 0.2 times a distance between the light-emitting devices.

14. A light-emitting device comprising:
a base member that comprises conductor wirings;

a light-emitting element that is mounted on the base member and emits first light;

a wavelength conversion member that is disposed on or above an upper surface of the light-emitting element and is adapted to absorb at least part of the first light and emit second light with a wavelength longer than a wavelength of the first light;

a light-reflective film that is disposed on an upper surface of the wavelength conversion member;

an encapsulating member that covers the light-emitting element, the wavelength conversion member, and the light-reflective film; and a white member that covers lateral surfaces of the light-emitting element, the white member being in contact with the wavelength conversion member, wherein a ratio (H/W) of a height (H) to a width (W) of the encapsulating member is 0.3 or less.

15. A light-emitting device comprising:

a base member that comprises conductor wirings;

a light-emitting element that is flip-chip mounted on the base member and emits first light;

a wavelength conversion member that is disposed on or above an upper surface of the light-emitting element and is adapted to absorb at least part of the first light and emit second light with a wavelength longer than a wavelength of the first light;

a light-reflective film that is disposed on an upper surface of the wavelength conversion member;

an encapsulating member that covers the light-emitting element, the wavelength conversion member, and the light-reflective film; and a white member that covers lateral surfaces of the light-emitting element, the white member being in contact with the wavelength conversion member, wherein a ratio (H/W) of a height (H) to a width (W) of the encapsulating member is smaller than 0.5.

* * * * *